United States Patent [19]

Homic

[11] Patent Number: 5,509,811
[45] Date of Patent: Apr. 23, 1996

[54] COMPUTER ENCLOSURE WITH EMBEDDED PCMCIA MODEM CARD

[75] Inventor: Michael J. Homic, Austin, Tex.

[73] Assignee: Dell USA, L.P., Austin, Tex.

[21] Appl. No.: 180,269

[22] Filed: Jan. 12, 1994

[51] Int. Cl.⁶ ..................................... H01R 9/11
[52] U.S. Cl. .......................... 439/55; 439/928.1
[58] Field of Search ........................ 439/55, 928, 928.1

[56] References Cited

U.S. PATENT DOCUMENTS

| | | | |
|---|---|---|---|
| 5,139,439 | 8/1992 | Shie | 439/928 X |
| 5,183,404 | 2/1993 | Aldous et al. | 439/131 X |
| 5,375,076 | 12/1994 | Goodrich | 364/708.1 |

OTHER PUBLICATIONS

Open MODEM Card 4–Pin I/O, PCMCIA PC Card Standard—Release 2.1.
XJack Megahertz™ Advertisements depicting PCMCIA and XJack connector.

*Primary Examiner*—Kenneth J. Ramsey
*Attorney, Agent, or Firm*—Mike Heim; James Huffman

[57] ABSTRACT

A modem assembly for a computer is disclosed that includes a cavity that receives a PCMCIA Modem Card which is displaced a distance x within the interior of the computer housing. The PCMCIA Modem Card includes a standardized PCMCIA Modem input/output connector. The modem assembly includes a connector block that comprises a body potion and an end cap. The body potion of the connector block includes one or more telephone sockets that are mounted flush to the exterior surface of the computer enclosure. The end cap protrudes downwardly and outwardly from the body potion, with a thickness x and a width and height approximately equal to the cross-sectional height and width of the PCMCIA Modem Card, to mount flat with the computer enclosure and to seal the PCMCIA Modem Card within the computer enclosure. The end cap includes an electrical socket that mates physically and electrically with the standardized PCMCIA input/output connector.

14 Claims, 4 Drawing Sheets

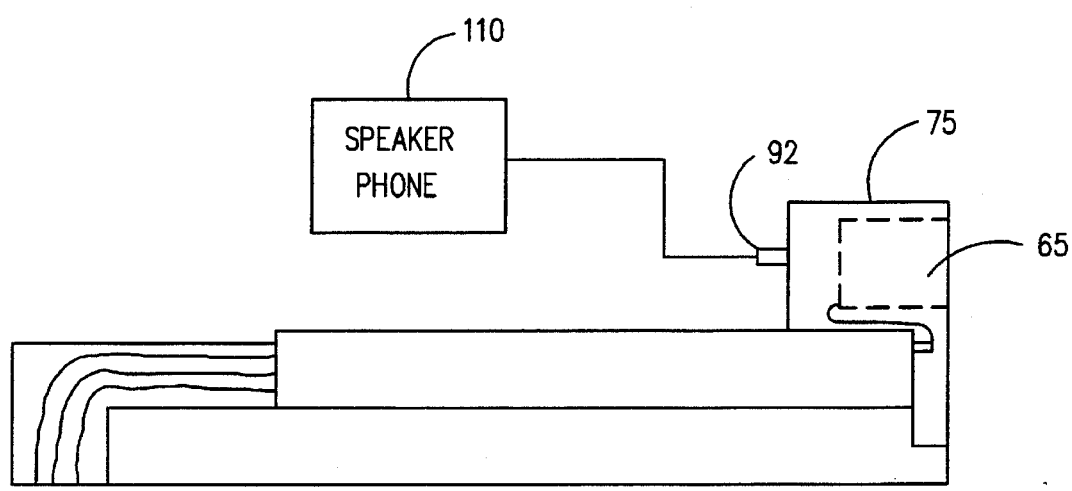
FIG. 7
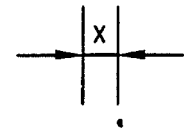

COMPUTER ENCLOSURE WITH EMBEDDED PCMCIA MODEM CARD

BACKGROUND OF THE INVENTION

The present invention relates generally to a system for providing modem capabilities in a personal computer. More particularly, this invention relates to a modem assembly that is compatible with standard input/output connectors on PCMCIA cards, which typically are used with a portable personal computer. Still more particularly, the present invention relates to a modem interface connector that attaches to a standard internal DAA (Data Access Arrangement) PCMCIA Modem Card and which mounts flush to the outer housing of the portable personal computer for providing an electrical connection between the PCMCIA Modem Card and a telephone jack.

Within the last few years, PCMCIA cards have become widely used in laptop, notebook and other portable computers. PCMCIA cards are constructed according to certain specifications and standards as set forth by the Personal Computer Memory Card International Association, commonly referred to as PCMCIA PC Card Standards. One standard, for example, is that PCMCIA cards have a 68 pin interface that is received in a card socket mounted in the personal computer for transmitting and receiving electrical signals to and from the computer motherboard.

The first PCMCIA cards were strictly memory cards that were designed to expand the memory of the computer. The PCMCIA cards typically are inserted into a slot or card socket in the computer, much like a conventional floppy disc, except that the card socket has female receptacles to receive the male connection or pins on the PCMCIA card. PCMCIA cards have been introduced that add modem functions and connections, network functions and connections, and numerous other capabilities to the portable computer, in addition to adding memory. Thus, PCMCIA cards provide the user with the capability of adding memory or peripheral devices to the portable computer without the necessity of taking the cover off of the computer to add additional boards or cards.

PCMCIA Modem Cards have become increasingly popular in recent years as a way to link the portable personal computer to telephone lines in order to transmit data to and receive data from a remote computer. Thus, an individual working at home, or who is travelling, can transmit data and facsimiles from a portable personal computer to a computer at a remote facility through the use of a PCMCIA Modem Card. In accordance with conventional techniques, the PCMCIA Modem Card includes input/output (I/O) connectors that electrically connect via a connector interface to a standard RJ-11 telephone jack. The telephone jack typically connects between a telephone line and the telephone itself or an equivalent connector.

As will be understood by one skilled in the art, the Modem Card translates and reconfigures binary signals from the computer into analog signals that are capable of being transmitted over telephone lines. Thus, in accordance with normal convention, a modem at the transmitting computer receives binary digital code from the computer and converts the binary code into modem frequency signals that are transmitted over the telephone lines to a receiving modem. The receiving modem then converts the modem frequency signal back to binary digital code, which is then applied as an input signal to the receiving computer.

Because modems provide an interface between telephone lines and personal computers, the Federal Communications Commission ("FCC") and the telephone companies require that any such interface must be constructed to protect the phone lines and systems from damage to preserve the integrity of transmissions over the telephone lines. In order to comply with these requirements, modems typically include a Data Access Arrangement (DAA) circuit. The DAA circuit protects the telephone line from disabling influences emanating from the computer or modem. The DAA circuit also provides an impedance match and also serves to isolate the modem and the computer from transient signals and other disturbances coming in over the telephone line. An internal DAA circuit may be provided as part of the PCMCIA Modem Card.

Recently, the Personal Computer Memory Card International Association has adopted Modem Card Connector standards in an attempt to standardize the connectors used on internal DAA PCMCIA Modem Cards which interface directly to the telephone system. These standards require a standardized 4-pin electrical input/output connector on the DAA PCMCIA Modem Card and a standardized physical connector arrangement.

Currently, there are two general types of interface connectors that are commercially available to connect the DAA PCMCIA Modem Card to the standard RJ-11 telephone jack. The first type of interface connector requires an external adaptor assembly to connect the PCMCIA Modem Card to the RJ-11 telephone socket. As shown in the prior art drawing of FIG. 1, the first type of interface connector 5 comprises an electrical connector plug 10 that connects physically and electrically to the PCMCIA Modem Card 12 at I/O connectors 15. The interface connector 5 includes an external module 18 that houses an external DAA circuit and an RJ-11 telephone socket 17. An RJ-11 telephone plug (not shown) is inserted into RJ-11 telephone socket 17 to complete the connection to the telephone line. Module 18 connects electrically to the connector plug 10 through a connector cable 16.

The interface connector assembly shown in FIG. 1 has a number of shortcomings. As will be recognized by one skilled in the art, the interface connector 5 shown in FIG. 1 requires the user to carry the adaptor assembly (comprising plug 10, cord 16 and module 18) at all times, and to connect the assembly to the PCMCIA Modem Card 12 when modem capabilities are desired. If the user fails to carry the interface connector, modem capabilities are lost. In addition, because the interface connector assembly 5 of FIG. 1 is mounted externally to the personal computer 11, the assembly requires space in addition to the space occupied by the computer and, furthermore, the assembly is susceptible to being dislodged as the personal computer is repositioned in the work space.

In an attempt to overcome these deficiencies, Megahertz® has introduced the XJACK® connector. See U.S. Pat. No. 5,183,404. The XJACK® connector, shown in FIG. 2, comprises a PCMCIA Card 20 with an RJ-11 telephone socket 25 mounted integrally with the PCMCIA Card 20 on a retractable unit 29. An RJ-11 telephone plug is inserted into RJ-11 telephone socket to complete the connection to the telephone line. The retractable unit 29 extends from the body of the PCMCIA Card 20 by depressing a lever 27 on the side of the PCMCIA Card 20 when modem capabilities are desired. When travelling, or when modem capabilities are unnecessary, the retractable unit 29 can be re-inserted back into the body of the PCMCIA Card 20. See U.S. Pat. No. 5,183,404.

One potential problem with the Megahertz® XJACK® connector is that it does not comply with the new standards adopted by the Personal Computer Memory Card International Association because the XJACK® connector does not include the 4-pin connector for the PCMCIA Card, nor can one be added because of the position of the integral RJ-11 telephone socket. As such, the Megahertz® XJACK® connector does not use the PCMCIA standard connector and interface. In addition, because the RJ-11 telephone socket 25 in the Megahertz® design extends from the body of the personal computer when in use, there exists a possibility that the socket 25 could be damaged or broken as the computer is repositioned by the user.

There is no PCMCIA modem system in use today that offers an integral RJ-11 telephone socket in an interface connector assembly that complies with current PCMCIA standards. Faced with these shortcomings in the industry, it would be advantageous to develop a modem connector interface that mounts integrally to the PCMCIA Modem Card without the necessity of additional connections or external adaptor cords. It also would be advantageous to develop a connector interface for an internal DAA PCMCIA Modem Card that mounts flush to the housing of the personal computer.

These and other advantages and features of the present invention will become apparent upon a reading of the description of the preferred embodiment provided herein.

SUMMARY OF THE INVENTION

The present invention solves the shortcomings and deficiencies of the prior art by constructing an embedded internal DAA PCMCIA Modem that includes a standardized input/output connector that, in the preferred embodiment, physically and electrically connects to an RJ-11 telephone socket through a connector block assembly. A card socket receiving the PCMCIA Modem Card is positioned so that the Modem Card, when fully inserted into the card socket, is recessed within the computer housing a distance x. The mechanical and electrical interface between the PCMCIA Card and the RJ-11 telephone socket is provided by the connector block, which includes a flange or end cap, with a width x, that mounts to the exterior side of the PCMCIA Modem Card, and which extends on its exterior side to the outer surface of the computer housing to present a flush external appearance. The interior side of the flange or end cap includes electrical socket connectors that connect electrically to the standard PCMCIA Modem Card input/output connectors. The body of the connector block, which preferably extends above the PCMCIA Card, receives one or more RJ-11 telephone sockets positioned in a flush alignment to the outer surface of the computer housing for receiving RJ-11 telephone plugs.

In an alternative arrangement, the connector block may be positioned remotely from the PCMCIA Modem Card, with an end cap providing electrical connections between the input/output connectors of the PCMCIA Modem Card and the connector block. The outer surface of the end cap mounts in a flush alignment to the outer surface of the computer housing, and connects integrally to the input/output connector of the PCMCIA Modem Card. The end cap also includes an electrical connector which connects electrically to the block connector through electrical conductors, thus enabling the block connector to be positioned in any convenient position within the computer. In the preferred embodiment, the block connector receives one or more RJ-11 telephone sockets and is positioned on the outer surface of the computer housing to provide a flush appearance.

BRIEF DESCRIPTION OF THE DRAWINGS

For a more detailed description of the preferred embodiment of the present invention, reference will now be made to the accompanying drawings, wherein:

FIG. 7 is a front elevation of an interface connector constructed in accordance with another alternative embodiment.

DETAILED DESCRIPTION OF THE PREFERRED EMBODIMENT

Figure 1:
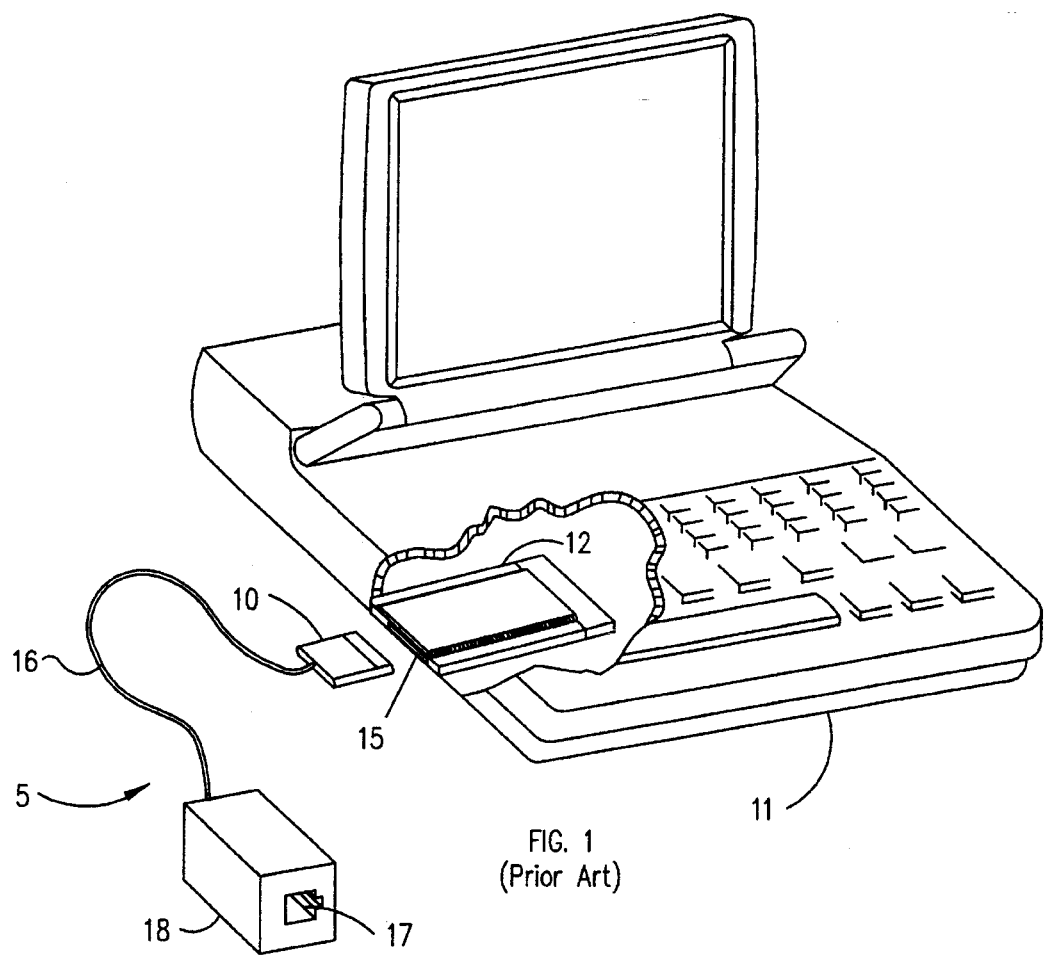
FIG. 1 depicts a partially sectional, perspective view of a prior art PCMCIA Modem Card connector arrangement.
Figure 2:
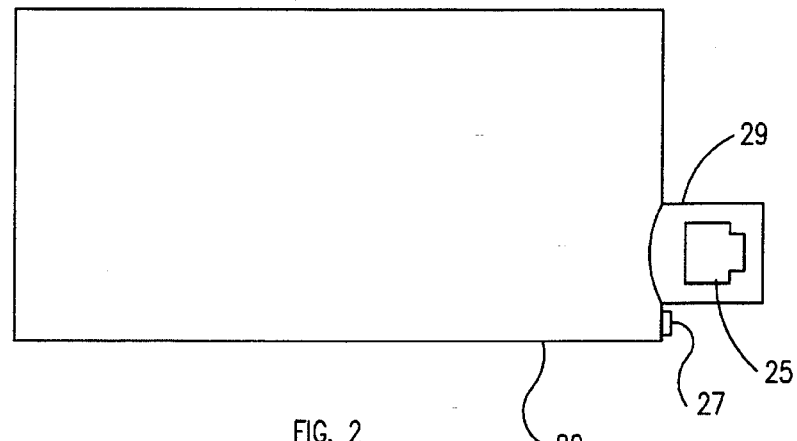
FIG. 2 shows a top view of a prior art PCMCIA Modem Card connector arrangement that is commercially available as the Megahertz® XJACK®.
Figure 3:
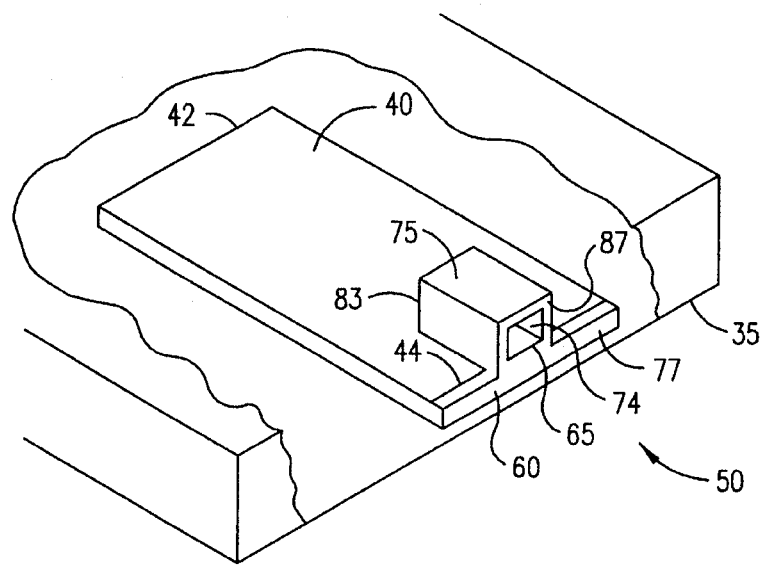
FIG. 3 is a partially sectional, perspective view of the PCMCIA Modem Card interface connector assembly constructed in accordance with the preferred embodiment.
Figure 4:
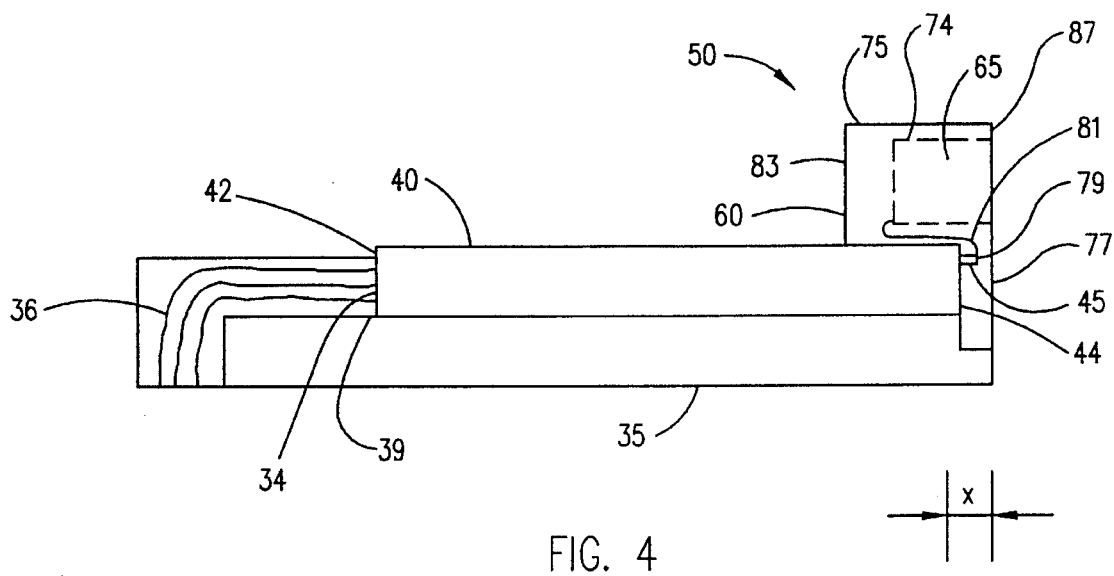
FIG. 4 is a front elevation of the interface connector assembly of FIG. 3.

Referring now to FIGS. 3 and 4, the PCMCIA Modem Card connector assembly 50 constructed in accordance with the preferred embodiment generally comprises an internal DAA PCMCIA Modem Card 40 with a standardized input/output (I/O) connector 45 and a connector block 60 electrically connected to the standardized I/O connector 45. In accordance with normal convention, the PCMCIA Modem Card 40 and the connector block 60 may be inserted into a personal computer 35 when modem capabilities are desired.

The PCMCIA Modem Card 40, in accordance with PCMCIA standards and as best seen in FIG. 4, includes a sixty-eight (68) pin connector 34 on an interior end 42 that is receivably connected to a standard sixty-eight (68) pin card socket 39 that is permanently mounted in the computer 35. The sixty-eight (68) pin connector 34 serves as a signal bus for the PCMCIA Card to transmit and receive electrical signals, through an electrical bus 36, to and from the computer motherboard (not shown). Similarly the exterior end 44 of the PCMCIA Modem Card preferably includes a standard four (4) pin input/output (I/O) connector 45 for providing an electrical connection to an RJ-11 telephone socket 65.

Referring still to FIGS. 3 and 4, and in accordance with the preferred embodiment of the present invention, the standard sixty-eight (68) pin card socket 39 is recessed a distance x inside the computer housing 35 so that the PCMCIA Modem Card 40 is embedded within the computer a distance x when fully inserted into the socket 39. As one skilled in the art will realize, the computer housing 35 must be adapted to provide a cavity in the computer enclosure for the PCMCIA Card that has the dimensions necessary to accommodate both the PCMCIA Modem Card 40 and the connector block 60 when it is attached to the PCMCIA Card. An example of such a cavity 86 can be seen in the side view of FIG. 5.

Figure 5:
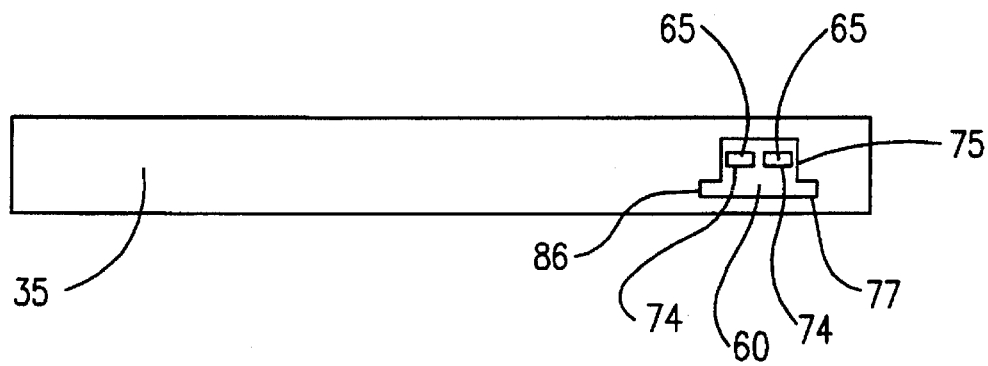
FIG. 5 is a side elevation of the interface connector assembly of FIG. 3.

Referring now to FIGS. 3, 4 and 5, the connector block 60 constructed in accordance with the preferred embodiment includes a body portion 75 for receiving the RJ-11 telephone socket, an end cap 77, and an electrical socket 79 in the end cap 77 to receive the electrical pins of input/output connector 45. The body portion 75 and end cap 77 preferably are molded as an integral part. In the preferred embodiment, the body portion 75 and end cap 77 are both constructed of a common PC/ABS plastic blend such as GE Cycolony 2950 HF.

The body portion 75, as best seen in FIGS. 3 and 4, preferably has a generally rectangular cross-section, that includes an aperture 74 and a passage for housing electrical conductor 81. As one skilled in the art will understand, the dimensions of the body portion 75 will vary depending upon the number of RJ-11 telephone sockets 65 that are to be mounted in the body portion 75. The body portion 75 has an interior side 83 that faces inwardly with respect to the computer housing when the connector block 60 is attached to the PCMCIA Modem Card, and an exterior side 87 that preferably aligns evenly with the outer surface of the computer housing 35 when the connector block 60 is attached to the PCMCIA Modem Card 40.

The body portion 75 preferably is molded with one or more apertures 74 on its exterior side 87, each of which substantially conforms in size and shape to an RJ-11 telephone socket. Electrical conductors 81 are positioned within the body 75 and end cap 77. One end of the electrical conductor 81 connects to the standard connectors that extend from the RJ-11 telephone socket. The other end of electrical conductor 81 connects to a standardized socket 79 that mates electrically and physically with the PCMCIA Modem Card standard four (4) pin I/O connector 45. The electrical conductor 81, therefore, provides an electrical connection between the RJ-11 telephone socket 65 and the PCMCIA Modem Card I/O connector 45.

In accordance with the preferred embodiment, and as seen in FIGS. 3 and 5, the end cap 77 of the connector block 60 extends downwardly and outwardly from the body portion 75, with dimensions that approximate the cross-sectional width and height of the PCMCIA Modem Card 40, thereby closing and sealing the cavity 86 in the computer housing in which the PCMCIA Card is inserted. The end cap 77 preferably has a thickness x, as shown in FIG. 4, so that the outer surface of the end cap 77 is level with the outer surface of the computer housing 35 when the connector block 60 is attached to the PCMCIA Modem Card 40. The end cap 77 preferably includes the standard socket 79 for physically and electrically connecting to the standard four (4) pin I/O connector 45 of the PCMCIA Modem Card 40. The end cap 77 also preferably includes the electrical conductors 81, as mentioned supra, for electrically connecting the RJ-11 socket 65 to the standard I/O connector 45.

Referring now to FIGS. 4 and 5, and in accordance with the principles of the present invention, the connector block 60 houses one or more RJ-11 telephone sockets 65 in aperture(s) 74. Two RJ-11 telephone sockets 65 are provided in the preferred embodiment (shown in FIG. 5), one of which connects to a telephone line (not shown), and one of which connects to a telephone (not shown). According to this embodiment, the telephone can be used except when the modem is activated and the computer is communicating over the telephone line.

The PCMCIA Modem assembly of the preferred embodiment is installed by first inserting the PCMCIA Modem Card 40 in its socket 39. Next, the connector block 60 is attached to the standard four (4) pin I/O connector 45 of the PCMCIA Modem Card. When properly installed, the connector block 60 preferably mounts flush with the computer housing 35.

After installing the PCMCIA Modem Card 40 and the connector block 60, the user plugs an RJ-11 telephone plug (which is connected to the telephone line) into the RJ-11 telephone socket 65 mounted in the connector block 60.

Figure 6:
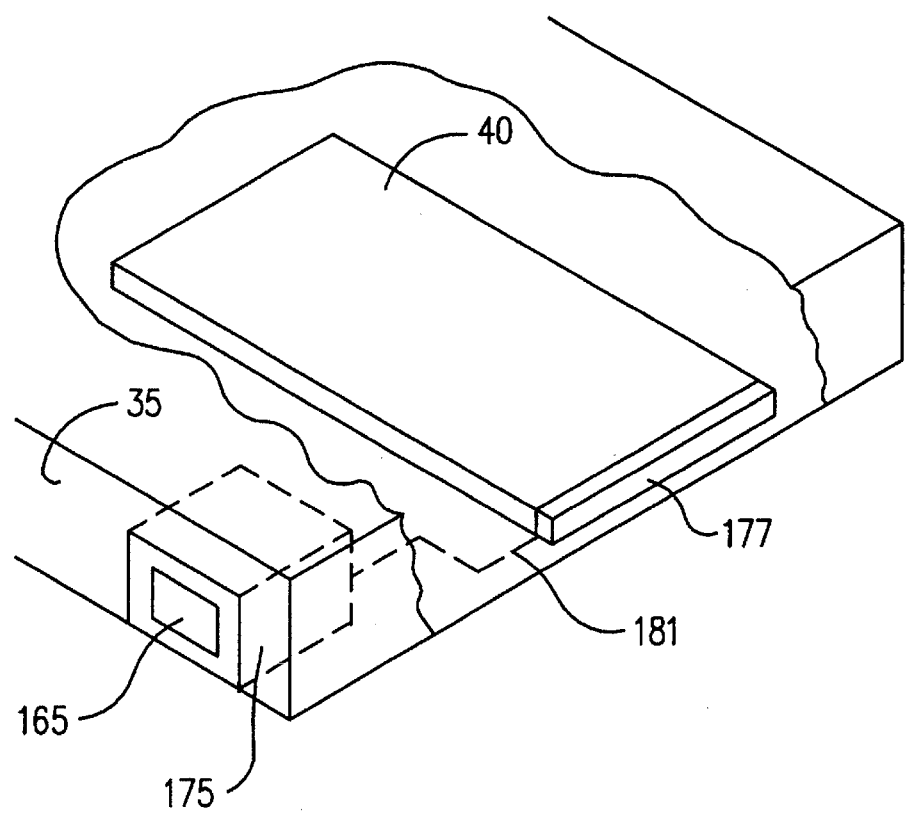
FIG. 6 is a partially sectional, perspective view of the PCMCIA Modem Card interface connector assembly constructed in accordance with an alternative embodiment.

In an alternative embodiment, shown in FIG. 6, the body portion of the connector block may be mounted separately from the end cap. As shown in FIG. 6, the body portion 175, with the RJ-11 telephone socket 165, may be positioned remotely from the PCMCIA Modem Card 40. In this embodiment, end cap 177 mounts over the PCMCIA Card 40 and electrically connects to the standard PCMCIA Modem Card four (4) pin I/O connector. An electrical connector 181 is provided within the computer housing 35, or, alternatively, is positioned in the wall of the computer housing, to provide an electrical connection between the end cap 177 and the RJ-11 telephone socket(s) 165 mounted in the remotely positioned body portion 175. As in the preferred embodiment, the body portion 175 mounts flush with the exterior surface of the computer housing 35.

In yet another embodiment, shown in FIG. 7, the body portion 75 may also include an electrical connector 92 for providing an electrical connection from the RJ-11 telephone socket 65 directly to an internal speaker phone 110 in the personal computer.

While a preferred embodiment and several alternative embodiments of the present invention have been disclosed, one skilled in the art will realize that numerous modifications can be made to these embodiments without departing from the principles of this invention.

I claim:

1. A modem assembly for a computer, said computer including an enclosure with an outer wall, comprising:

a socket receiving a removable PCMCIA Modem Card, said PCMCIA Modem Card including a standard PCMCIA Modem Card input/output connector;

a connector block physically and electrically connected to said input/output connector, said connector block including a body portion housing a telephone socket, and said connector block and said telephone socket residing flush with said outer wall; and wherein said connector block also includes an end cap including an electrical socket mating with said standard PCMCIA Modem Card input/output connector.

2. A modem as in claim 1, wherein said PCMCIA card is recessed a distance x within the outer wall of the computer when inserted into said socket; and said end cap has a thickness x, extending over said PCMCIA Modem Card.

3. A housing for a PCMCIA Card in a computer, said PCMCIA Card including an input/output connector, said housing comprising:

a cavity, including a socket for receiving said PCMCIA Card, said PCMCIA card being recessed a distance x within an outer surface of the computer when inserted into said socket;

an end cap, with a thickness x, for closing and sealing the cavity, said end cap including an electrical connector that connects to said PCMCIA Card.

4. A housing as in claim 3, wherein said PCMCIA Card comprises an internal DAA Modem Card.

5. A housing as in claim 4, wherein said input/output connector comprises a standard four (4) pin connector for the DAA Modem Card.

6. A housing as in claim 5, further comprising a connector body electrically connected to said end cap, said connector body including an RJ-11 telephone socket.

7. A housing as in claim 6, wherein said connector body is integrally mounted to said end cap.

8. A modem assembly for a computer, comprising:
- a socket in the computer for receiving a PC card, said PC card being recessed a distance x within an outer surface of the computer when inserted into said socket;
- a connector block connected to said PC Card, said connector block including:
  - a body portion in which a telephone socket is mounted; and
  - an end cap, with a thickness x, extending over said PC card;
  - wherein said body portion and said end cap mount flush with the outer surface of the computer when connected to the PC Card; and wherein the body portion is located remotely from said end cap.

9. A modem assembly as in claim 8, wherein the end cap has a height and width approximately equal to the cross-sectional height and width of the PC Card.

10. A modem assembly as in claim 8, wherein said PC Card includes a standard PCMCIA Modem Card four (4) pin input/output connector, and said end cap includes an electrical socket that physically and electrically connects to said input/output connector.

11. A modem assembly as in claim 8, wherein a plurality of telephone sockets are mounted in said body portion.

12. A modem assembly as in claim 8, wherein a telephone plug is received in said telephone socket.

13. A modem assembly for a computer, comprising:
- a socket in the computer for receiving a PC card, said PC card being recessed a distance x within an outer surface of the computer when inserted into said socket;
- a connector block connected to said PC Card, said connector block including:
  - a body portion in which a telephone socket is mounted, said telephone socket capable of receiving a telephone plug; and
  - an end cap, with a thickness X, extending over said PC card;
  - wherein said body portion and said end cap mount flush with the outer surface of the computer when connected to the PC Card; and
  - wherein said body portion includes an electrical connector for providing a connection between said telephone socket and an internal speaker phone.

14. A modem assembly for a computer, comprising:
- a socket in the computer for receiving a PCMCIA Modem Card, said PCMCIA Modem Card being recessed a distance x within an outer surface of the computer when inserted into said socket;
- a connector block connected to said PCMCIA Modem Card, said connector block including
- a body portion in which a telephone socket is mounted; and
- an end cap, with a thickness x, extending over said PCMCIA Modem Card, and with a height and width approximately equal to the cross-sectional height and width of the PCMCIA Modem Card;
- wherein said body portion and said end cap mount flush with the outer surface of the computer when connected to the PCMCIA Modem Card; and
- wherein said PCMCIA Modem Card includes a standard PCMCIA Modem Card four (4) pin input/output connector, and said end cap includes an electrical socket that physically and electrically connects to said input/output connector.

* * * * *